US010391607B2

(12) United States Patent
Kawasaki (10) Patent No.: US 10,391,607 B2
(45) Date of Patent: Aug. 27, 2019

(54) SINGLE-WAFER PROCESSING METHOD OF POLISHING ONE SIDE OF SEMICONDUCTOR WAFER AND SINGLE-WAFER PROCESSING APPARATUS FOR POLISHING ONE SIDE OF SEMICONDUCTOR WAFER (71) Applicant: SUMCO CORPORATION, Tokyo (JP)

(72) Inventor: Tomonori Kawasaki, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 15/552,563

(22) PCT Filed: Oct. 6, 2015

(86) PCT No.: PCT/JP2015/005085
§ 371 (c)(1),
(2) Date: Aug. 22, 2017

(87) PCT Pub. No.: WO2016/135787
PCT Pub. Date: Sep. 1, 2016

(65) Prior Publication Data
US 2018/0036864 A1 Feb. 8, 2018

(30) Foreign Application Priority Data
Feb. 25, 2015 (JP) .................................. 2015-035650

(51) Int. Cl.
B24B 37/30 (2012.01)
H01L 21/306 (2006.01)
H01L 21/02 (2006.01)

(52) U.S. Cl.
CPC ........ B24B 37/30 (2013.01); H01L 21/02013 (2013.01); H01L 21/30625 (2013.01)

(58) Field of Classification Search
CPC .............................. H01L 21/304; B24B 37/30
(Continued)

(56) References Cited

U.S. PATENT DOCUMENTS 4,839,005 A    6/1989  Katsumoto et al.
5,934,984 A *  8/1999  Togawa ................ B24B 37/105
                                                   414/936

(Continued)

FOREIGN PATENT DOCUMENTS

JP    9-174394      7/1997
JP    2000-77369 A  3/2000
JP    2004-72025 A  3/2004
JP    3978780 B     9/2007

OTHER PUBLICATIONS

Search Report issued in International Bureau of WIPO Patent Application No. PCT/JP2015/005085, dated Dec. 28, 2015.

(Continued)

Primary Examiner — Robert A Rose
(74) Attorney, Agent, or Firm — Greenblum & Bernstein, P.L.C.

(57) ABSTRACT

An object is to provide a single-wafer processing single-side polishing method and a single-wafer processing single-side polishing apparatus, which increase the flatness of a semiconductor wafer and reduce variations in flatness. The single-wafer processing single-side polishing method includes a polishing step of polishing a semiconductor wafer; and a shifting step of transferring the semiconductor wafer from a polishing plate to a tray outside the polishing plate, moving the relative position of the semiconductor wafer and the polishing head in the rotation direction of the polishing head, and then holding the semiconductor wafer with the polishing head. The polishing step is performed a plurality of times, and the shifting step is performed at least once between the plurality of polishing steps.

4 Claims, 7 Drawing Sheets (58) Field of Classification Search
USPC ............... 451/287, 288, 289, 290, 41, 57, 5
See application file for complete search history.

(56) References Cited

U.S. PATENT DOCUMENTS

| | | | | |
|---|---|---|---|---|
| 6,312,312 B1* | 11/2001 | Togawa | ................... | B23Q 7/06 |
| | | | | 451/288 |
| 7,044,832 B2* | 5/2006 | Yilmaz | ................. | B24B 37/345 |
| | | | | 451/288 |
| 2006/0068681 A1 | 3/2006 | Tsuchiya | | |

OTHER PUBLICATIONS

Office Action issued in Taiwan Counterpart Patent Appl. No. 104133969, dated May 19, 2017, along with an english translation thereof.
Office Action issued in Republic of Korea Counterpart Patent Appl. No. 10-2015-0163036, dated Jun. 7, 2016 , along with an english translation thereof.
Office Action issued in Republic of Korea Counterpart Patent Appl. No. 10-2015-0163036, dated Dec. 28, 2016 , along with an english translation thereof.
Office Action issued in Republic of Korea Counterpart Patent Appl. No. 10-2015-0163036, dated Mar. 7, 2017 , along with an english translation thereof.
International Preliminary Report on Patentability and Written Opinion from International Bureau of WIPO Patent Application No. PCT/JP2015/005085, dated Aug. 29, 2017.
Office Action issued in Japanese family member Patent Appl. No. 2015-035650, dated Jul. 3, 2018 , along with an English translation thereof.

* cited by examiner

RELATED ART

Step 1A

Step 1B

SINGLE-WAFER PROCESSING METHOD OF POLISHING ONE SIDE OF SEMICONDUCTOR WAFER AND SINGLE-WAFER PROCESSING APPARATUS FOR POLISHING ONE SIDE OF SEMICONDUCTOR WAFER

TECHNICAL FIELD

This disclosure relates to a single-wafer processing method of polishing one side of a semiconductor wafer and a single-wafer processing apparatus for polishing one side of a semiconductor wafer.

BACKGROUND

Methods for polishing surfaces of semiconductor wafers such as silicon wafers required to be highly flat are broadly classified into two types: a double-side polishing process for simultaneously polishing both sides of a semiconductor wafer and a single-side polishing process for polishing only one side thereof. Single-side polishing processes are used in a wide variety of applications from lapping using a relatively stiff polishing cloth to final polishing using a relatively soft polishing cloth.

Here, a typical single-side polishing process using a conventional single-side polishing apparatus 10 will be described with reference to FIG. 1. The polishing apparatus 10 has a polishing head 12 holding a semiconductor wafer 1 with a backing plate 11 therebetween, and a rotatable platen 14 to which a polishing cloth 13 is bonded. The polishing head 12 includes a rotation mechanism for rotating the polishing head 12, and a transfer mechanism for moving the polishing head 12 inside and outside the rotatable platen 14. In this single-side polishing apparatus 10, the polishing head 12 holds the semiconductor wafer 1 and at the same time presses a polishing target surface of the semiconductor wafer 1 (i.e., the surface opposite to the polishing head 12) against the polishing cloth 13 bonded to the top of the rotatable platen 14. Both the polishing head 12 and the rotatable platen 14 are rotated to allow relative movement of the polishing head 12 and the rotatable platen 14, thereby performing chemical mechanical polishing only on the polishing target surface of the semiconductor wafer 1 with a polishing agent 16 being supplied from a polishing agent supply means 15.

Single-side polishing provides somewhat high flatness but not a completely flat surface. In particular, poor flatness at the periphery of a semiconductor wafer after polishing, which is referred to as "surface sag" has been unavoidable to date. To address this problem, attempts have been made to obtain a semiconductor wafer with high flatness by preventing surface sag due to polishing.

For example, JP H09-174394 A (PTL 1) discloses a method of polishing a semiconductor wafer, in which a polishing time required to complete polishing is divided into at least two stages and an interruption is scheduled between the divided polishing stages, thereby performing multi-step polishing on a single semiconductor wafer. In this polishing method, multi-step polishing is performed with an interruption being scheduled between polishing steps to prevent poor flatness caused due to possibly long polishing time, thereby inhibiting surface sag of the polished surface.

CITATION LIST

Patent Literature

PTL 1: JP H09-174394 A

SUMMARY

Technical Problem

Although the polishing method disclosed in PTL 1 allows a semiconductor wafer to be made flatter than conventional wafers by final polishing, the semiconductor wafer polished by the method is not sufficiently flat for today's ongoing miniaturization of devices. Further, great variations in flatness between a plurality of semiconductor wafers having been polished can reduce the yield.

In view of the above problems, it could be helpful to provide a single-wafer processing method of polishing one side of a semiconductor wafer and a single-wafer processing apparatus for polishing one side thereof, which can increase the flatness of the semiconductor wafer having been polished and prevent variations in flatness.

Solution to Problem

The inventor has intensively studied ways to solve the above problems. Here, as described above, a semiconductor wafer is held by suction on a polishing head with a backing plate therebetween. Since the backing plate is bonded to the polishing head with an adhesive etc., unavoidable slight irregularities of nanometer order are formed on the holding surface of the backing plate that holds the semiconductor wafer due to the influence of the members of the backing plates. In polishing, such irregularities cause uneven pressure on the semiconductor wafer, so that the slight irregularities on the surface on which the semiconductor wafer is hold are reflected on the semiconductor wafer having been polished. Thus, the shape removed by polishing varies in a surface of the semiconductor wafer. The inventor focused on this since it causes poor flatness or flatness variation significantly in a peripheral portion of the wafer. Thereupon, by way of experiment, the inventor performed a shifting step of moving the relative position of a polishing head and a semiconductor wafer in the rotation direction of the polishing head and then making the polishing head hold the semiconductor wafer. Thus, the inventor found that the influence of the slight irregularities can be leveled, so that the flatness of the semiconductor wafer having been polished can be improved and variation in the flatness can be reduced. This discovery led to the present invention.

Specifically, we propose the following features.

The disclosed single-wafer processing method of polishing one side of a semiconductor wafer includes a polishing step of pressing the semiconductor wafer held by a polishing head against a polishing plate thereby polishing the semiconductor wafer; and a shifting step of transferring the semiconductor wafer held by the polishing head from the polishing plate to a tray outside the polishing plate, then detaching the semiconductor wafer from the polishing head, placing the semiconductor wafer on the tray, moving a relative position of the semiconductor wafer placed and the polishing head in a rotation direction of the polishing head, and then holding the semiconductor wafer placed with the polishing head. The polishing step is performed a plurality of times, and the shifting step is performed at least once between the plurality of polishing steps.

Here, when the plurality of times is N times where N is an integer of 2 or more), the shifting step is preferably performed (N−1) times.

In this case, the relative position is preferably moved in the rotation direction by (360/N) degrees in the shifting step.

The disclosed single-wafer processing apparatus for polishing one side of a semiconductor wafer includes a polishing head which holds the semiconductor wafer and includes a rotation mechanism and a transfer mechanism; a polishing plate to which a polishing cloth for polishing the semiconductor wafer is bonded; a table including a tray on which the semiconductor wafer is to be placed; and a control unit for controlling a relative position of the semiconductor wafer and the polishing head in a rotation direction of the polishing head when the semiconductor wafer placed on the tray is held by the polishing head.

In this case, the table preferably includes a rotating means.

Advantageous Effect

The relative position of the polishing head and the semiconductor wafer is moved in the rotation direction of the polishing head, followed by shifting by which the semiconductor wafer is held by the polishing head. Thus, a single-wafer processing method of polishing one side of the semiconductor wafer and a single-wafer processing apparatus for polishing one side of the semiconductor wafer that make it possible to increase the flatness of the semiconductor wafer after polishing and inhibit variation in the flatness can be provided.

DETAILED DESCRIPTION

Figure 2:
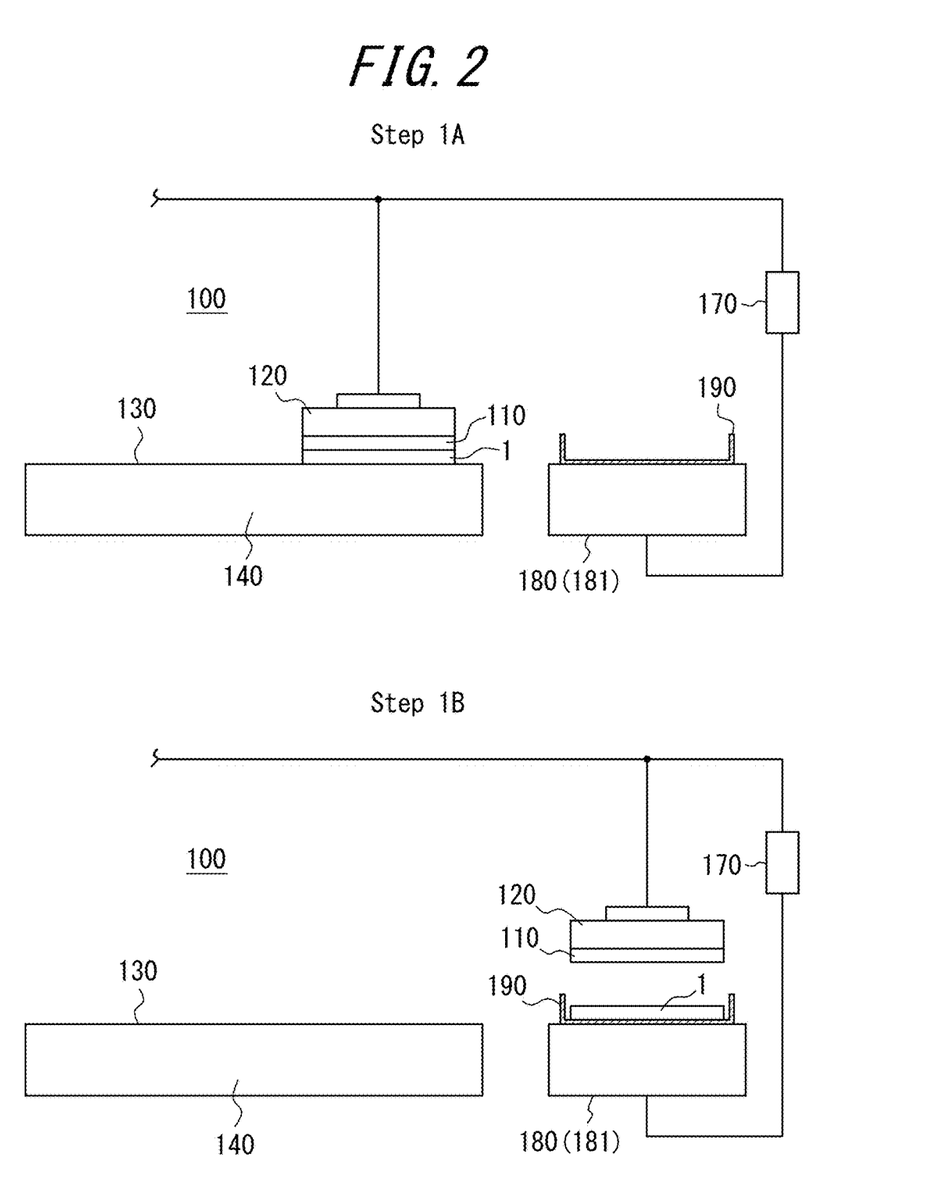
FIG. 2 is schematic views illustrating a single-wafer-processing method of polishing one side of a semiconductor wafer, according to one embodiment, which include a schematic view illustrating a polishing step as Step A and a schematic view illustrating a shifting step as Step B.

Embodiments of this disclosure will now be described with reference to the drawings. FIG. 2 schematically illustrates the cross-sectional structure of the disclosed single-wafer processing single-side polishing apparatus used in the steps of a single-wafer processing single-side polishing method. Step A in FIG. 2 depicts a schematic view illustrating a polishing step, and Step B in FIG. 2 depicts a schematic view illustrating a shifting step. In FIG. 2, for convenience of illustration, the height of the semiconductor wafer and the components of the apparatus is exaggerated, so the aspect ratio does not conform to the actual ratio. Further, for the sake of simplicity of the drawings, only the main parts of the configuration are schematically illustrated.

(Single-Wafer Processing Single-Side Polishing Apparatus)

FIG. 2 depicts a single-wafer processing single-side polishing apparatus 100. Step A in FIG. 2 depicts a schematic view of a polishing step using the single-wafer processing single-side polishing apparatus 100 according to one embodiment of this disclosure. This single-wafer processing single-side polishing apparatus 100 has a polishing head 120 which holds the semiconductor wafer 1 and includes a rotation mechanism and a transfer mechanism; a polishing plate 140 to which a polishing cloth 130 for polishing the semiconductor wafer 1 is bonded; and a table 180 including a tray 190 on which the semiconductor wafer 1 is placed. Here, the single-wafer processing single-side polishing apparatus 100 has a control unit 170 controlling the relative position of the semiconductor wafer 1 and the polishing head 120 in the rotation direction of the polishing head 120 when the semiconductor wafer 1 placed on the tray 190 is held by the polishing head 120. Such a structure enables performing a single-wafer-processing method of polishing one side of a semiconductor wafer, to be described. These components of the apparatus 100 will be described in detail below.

The polishing head 120 typically holds the semiconductor wafer 1 with a backing plate 110 therebetween. The polishing head 120 and the backing plate 110 are bonded with a conventionally known adhesive or the like. For holding the semiconductor wafer 1, surface tension effect by a liquid such as water or vacuum suction is typically used; however, the polishing head 120 can hold and detach the semiconductor wafer 1 using any given means. Further, this polishing head 120 includes a transfer mechanism capable of moving the polishing head 120 up and down, and inside and outside the polishing plate and also includes a rotation mechanism capable of rotating the polishing head 120.

The yarn count of the polishing cloth 130 to be bonded to the polishing plate 140 depends on the desired polishing purposes in different situations from lapping to final polishing. In polishing the semiconductor wafer 1, the polishing plate 140 is typically rotated using a motor or the like.

Figure 1:
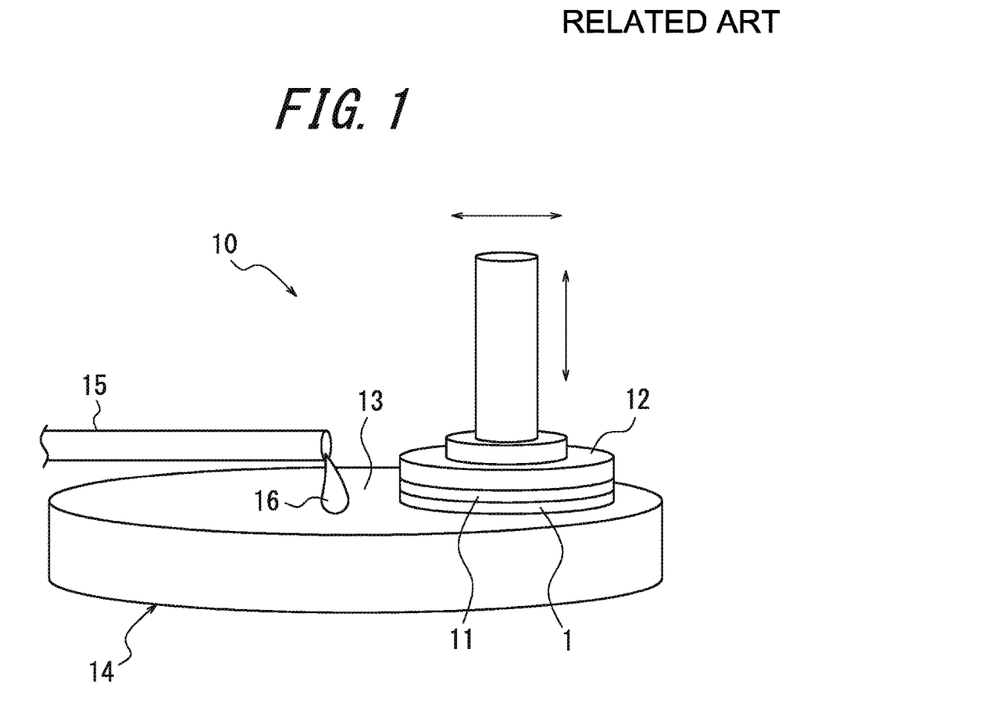
FIG. 1 is a schematic view illustrating a conventional method of polishing one side of a semiconductor wafer.

Although not shown, the single-wafer-processing single-side polishing apparatus 100 according to this embodiment may have the above-mentioned polishing agent supply means depicted in FIG. 1. With the use of the polishing agent supply means, chemical mechanical polishing can be performed on the semiconductor wafer 1. Of course, polishing of this embodiment is not limited to chemical mechanical polishing, and this disclosure can be applied also when mechanical polishing is used.

Outside the polishing plate 140, the tray 190 on which the semiconductor wafer 1 is temporarily placed is provided. The tray 190 is usually installed on the table 180. The table 180 may include a rotating means, in which case the rotation can be controlled with the control unit 170. As a specific example of the table 180 including a rotating means, a rotary table 181 can be given. In that case, the rotary table 181 may be installed on the tray 190. An embodiment in which a typical table without being provided with a rotating means is used will be described below.

Here, the control unit 170 which is a characteristic feature of this embodiment will be described. As stated above, the control unit 170 controls the relative position of the semiconductor wafer 1 and the polishing head 120 in the rotation direction of the polishing head 120 when the semiconductor wafer 1 placed on the tray 190 is held by the polishing head 120. Specifically, the relative position can be controlled in the following manner. That is, starting from the state where the semiconductor wafer 1 is held by the polishing head 120 as illustrated in Step A of FIG. 2, the polishing head 120 is transferred onto the tray 190 while holding the semiconductor wafer 1. Next, the semiconductor wafer 1 is detached from the polishing head 120 and placed on the tray 190 as illustrated in Step B of FIG. 2. After that, the polishing head 120 is rotated. A typical means like a motor can be used for the rotation itself; however, it is important to move the relative position of the semiconductor wafer 1 and the polishing head 120 in the rotation direction of the polishing head 120 by rotation by the desired rotation angle.

In a conventional single-side polishing apparatus, when a semiconductor wafer is held by a polishing head, alignment of the surface of the polishing head on which the wafer is held in the rotation direction with respect to a notch or an orientation flat provided on the semiconductor wafer is not performed, not to mention control of the above-mentioned relative position. As described above, since slight irregularities are present on the surface of the backing plate bonded to the polishing head, on which the semiconductor wafer is held, the influence of such irregularities limits improvement in the flatness of the semiconductor wafer having been polished and reduction of variations in flatness of a plurality of the semiconductor wafers having been polished.

Since the single-wafer processing single-side polishing apparatus 100 according to this embodiment has the above-mentioned control unit 170, shifting of the semiconductor wafer to be described can be performed. This shifting increases the flatness of the semiconductor wafer having been polished and reduces variations in the flatness.

It is also preferable that the single-wafer processing single-side polishing apparatus 100 according to this embodiment has a detection unit capable of detecting the degree of relative positional movement of the semiconductor wafer 1 and the polishing head 120 in the rotation direction of the polishing head 120. For such a detection unit, a laser-based detection unit may be provided on the polishing head 120. Alternatively, the angle by which the polishing head has been rotated can be detected for example by controlling the pulses sent to a servomotor for the polishing head 120.

Note that when the rotary table 181 including a rotating means is used as the table 180, one or both of the polishing head 120 and the rotary table 181 may be rotated in the above embodiment. As with the polishing head 120, the rotary table 181 can be rotated for example by controlling the pulses sent to the servomotor, and the angle of rotation of the rotary table can be detected.

(Single-Wafer Processing Single-Side Polishing Method)

Next, a single-wafer processing method of polishing one side of a semiconductor wafer (single-wafer processing single-side polishing method), according to one embodiment will be described.

The single-wafer processing method of polishing one side of a semiconductor wafer, according to one embodiment includes a polishing step of pressing a semiconductor wafer 1 held by a polishing head 120 against a polishing plate 140 thereby polishing the semiconductor wafer 1 (Step A in FIG. 2); and a shifting step of transferring the semiconductor wafer 1 held by the polishing head 120 from the polishing plate 140 to the tray 190 outside the polishing plate, then removing the semiconductor wafer 1 from the polishing head 120, placing the semiconductor wafer 1 on the tray 190, moving the relative position of the semiconductor wafer 1 placed and the polishing head 120 in the rotation direction of the polishing head 120, and then holding the semiconductor wafer 1 placed with the polishing head 120 (Step B in FIG. 2). In this embodiment, the polishing step is performed a plurality of times, and the shifting step is performed at least once between the plurality of polishing steps. These steps increase the flatness of the semiconductor wafer having been polished and reduce variations in the flatness. These steps are described below.

A characteristic feature of this embodiment is that the polishing step, as depicted by Step A in FIG. 2, is performed a plurality of times, and each of the plurality polishing steps can be performed using a usual method. As described above, the polishing head 120 holds the semiconductor wafer 1 and at the same time presses a polishing target surface of the semiconductor wafer 1 (i.e., the surface opposite to the polishing head 120) against the polishing cloth 130 bonded to the top of the polishing plate 140. Typically, both the polishing head 120 and the polishing plate 140 are rotated to allow relative movement of the polishing head 120 and the polishing plate 140, thereby performing chemical mechanical polishing only on the polishing target surface of the semiconductor wafer 1 with a polishing agent being supplied from a polishing agent supply means. Alternatively, only the polishing head 120 may be rotated, or only the polishing plate 140 may be rotated. Further, mechanical polishing may be performed without the supply of the polishing agent.

The shifting step, as depicted by Step B in FIG. 2, is performed with the control unit 170, and the relative position of the polishing head 120 and the semiconductor wafer 1 in the rotation direction of the polishing head 120 are as described above. That is, the semiconductor wafer 1 is temporarily removed from the polishing head 120 and placed on the tray 190; the relative position of the semiconductor wafer 1 and the polishing head 120 is moved in the rotation direction of the polishing head; and then the polishing head 120 holds the semiconductor wafer again, thereby shifting the semiconductor wafer 1.

Here, it is important in this embodiment that the polishing step, as depicted by Step A in FIG. 2, is performed a plurality of times, and at least one shifting step, as depicted by Step B in FIG. 2, is performed between the plurality of polishing steps. Specifically, performing the shifting step between the plurality of polishing steps can level the influence of slight irregularities of nanometer order present on the backing plate 110 that is the holding surface between the polishing head 120 and the semiconductor wafer 1. As a result, the flatness of the semiconductor wafer having been polished increases and variations in the flatness can be reduced.

In this embodiment, when the above plurality of times is N times (where N is an integer of 2 or more), the shifting step is preferably performed (N−1) times. In other words, a shifting step is preferably performed between every two of the plurality of subsequent polishing steps. This shifting of the semiconductor wafer levels the influence of the irregularities and increases the flatness of the semiconductor wafer having been polished and reduces variations in the flatness. As the number of shifting steps is larger, the influence of irregularities is smaller, which is preferable. On the other hand, an excessively large number of shifting steps reduces production efficiency. Accordingly, the upper limit can be for example, 100 times, without any intention to limit the invention. Meanwhile, since the advantageous effect can be obtained even when shifting is performed once, the lower limit of the number of the shifting steps is once. In order to increase production efficiency while better securing the advantageous effect, the shifting is performed preferably once to ten times, more preferably twice to eight times, and most preferably three times to six times.

Further, in this embodiment, the angle of rotation by which the relative position of the semiconductor wafer 1 and the polishing head 120 is moved in the rotation direction of the polishing head 120 is not specifically limited as long as the relative position changes. However, in order to level the influence of irregularities on the holding surface that holds the semiconductor wafer 1, the relative position is moved by rotation by preferably at least 2 degrees, more preferably, the relative position is changed by rotation of 5 degrees or more. In order to level and reduce the influence of irregularities, when the plurality of times is N times, the angle of rotation by which the relative position of the semiconductor wafer 1 and the polishing head 120 in the rotation direction of the polishing head 120 is preferably (360/N) degrees.

Here, irrespective of whether the shifting, which is a characteristic feature of this embodiment, is performed or not, the amount of material removed by polishing is proportional to the polishing time. The total polishing time T of the polishing steps performed N times can be set appropriately in accordance with the desired removal amount, and the polishing time of each polishing step is arbitrary. However, when the rotation angle is set to (360/N) degrees as described above, in order to level the influence of irregularities, the polishing time of each polishing step is preferably the same i.e., T/N).

This disclosure is applicable to any given semiconductor wafer. Examples include a silicon wafer and a compound semiconductor (GaAs, GaN, SiC) wafer without any intention to limit the invention thereto. Further, this disclosure is applicable to a semiconductor epitaxial wafer of which surface has an epitaxial layer.

As used herein, the term "the same" or "equal" does not imply strict mathematical equality, and may naturally involve errors tolerated as long as the operation and effect of the disclosed features can be achieved, including unavoidable errors caused in a process for producing a semiconductor wafer. For example, an error of approximately 2% is tolerated in this disclosure.

The single-wafer processing single-side polishing method and a single-wafer processing single-side polishing apparatus of this disclosure will be described in more detail below using examples. However, this disclosure is not limited to the following examples. For example, given members can be employed for the backing plate 110, the polishing head 120, the polishing cloth 130, the polishing plate 140, the table 180 (rotary table 181), and the tray 190.

Example 1

Example 1-1

A silicon wafer having a diameter of 300 mm and a thickness of 775 μm was prepared. A polishing cloth made of suede was placed on a surface of a polishing plate, thereby performing final polishing on the silicon wafer using the single-wafer processing single-side polishing apparatus 100 illustrated in FIG. 2. A suede member was used for the backing plate 110. Shifting of the silicon wafer was performed between polishing and polishing. The polishing conditions were as follows.

Polishing pressure: 135 g/cm$^2$
Number of polishing steps: six times (number of shifting steps: five times)
Total polishing time: 360 seconds
  Polishing time of each polishing step: 60 seconds
  Angle of rotation in shifting: 60 degrees
Polishing agent: alkaline polishing agent (containing colloidal silica)

Through the above single-side polishing, a silicon wafer according to Example 1-1 was obtained.

Example 1-2

A silicon wafer according to Example 1-2 was obtained in the same manner as in Example 1-1 except that the number of polishing steps, the polishing time, and the rotation angle in Example 1-1 were changed to the conditions presented in Table 1 below.

Conventional Example 1-1

A silicon wafer according to Conventional Example 1-1 was obtained in the same manner as in Example 1-1 except that the number of polishing steps, the number of shifting steps, the polishing time, and the rotation angle in Example 1-1 were changed to the conditions presented in Table 1 below. Accordingly, shifting steps were not performed in Conventional Example 1-1.

TABLE 1

|  | Example 1-1 | Example 1-2 | Conventional Example 1-1 |
| --- | --- | --- | --- |
| Number of polishing step | 6 | 3 | 1 |
| Number of shifting step | 5 | 2 | N/A |
| Polishing time of each polishing step | 60 s | 120 s | 360 s |
| Angle of rotation in shifting | 60° | 120° | N/A |
| Total polishing time | 360 s | 360 s | 360 s |

(Evaluation 1: Geometry of Silicon Wafer after Polishing)

Figure 3:
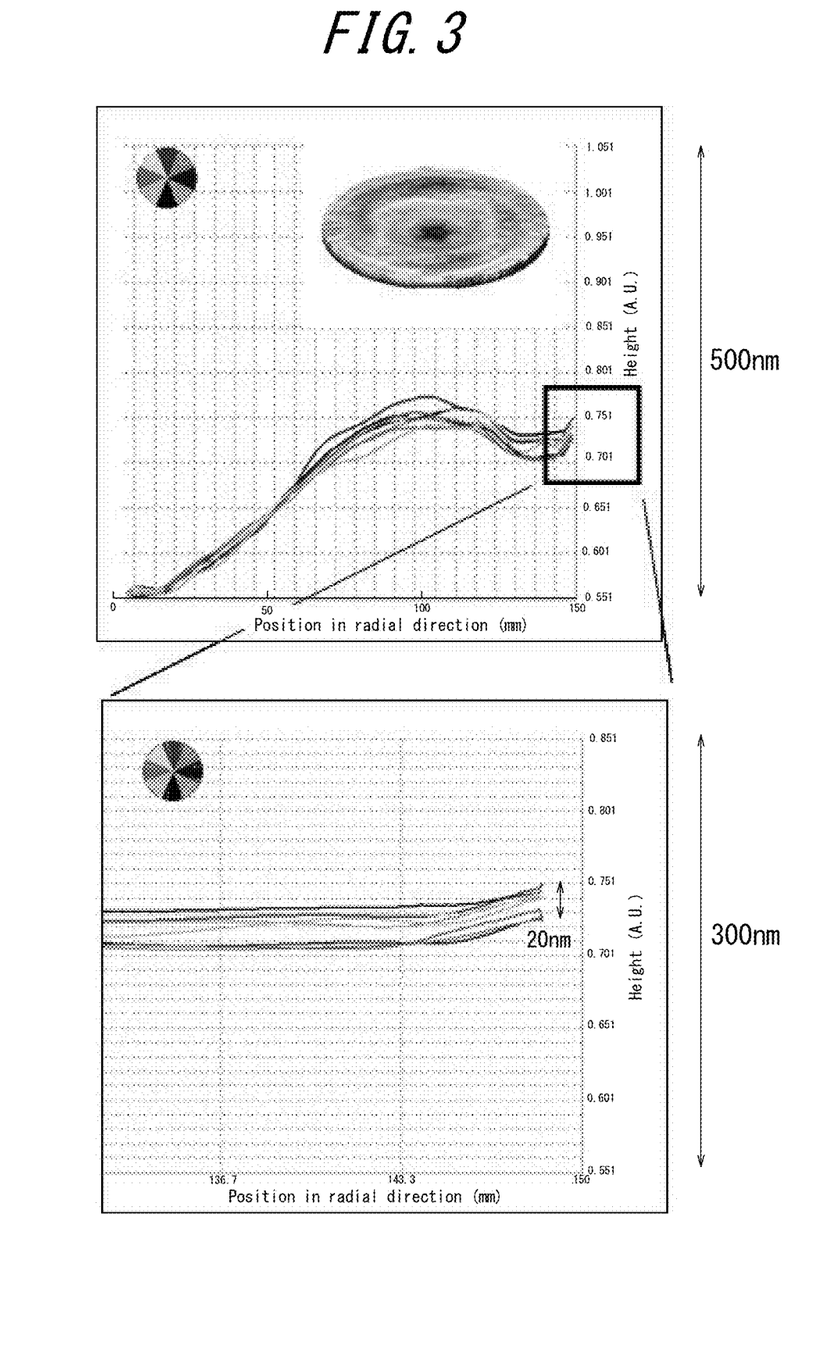
FIG. 3 is a graph illustrating the geometric profile of a silicon wafer subjected to single-side polishing in Example 1-1.
Figure 4:
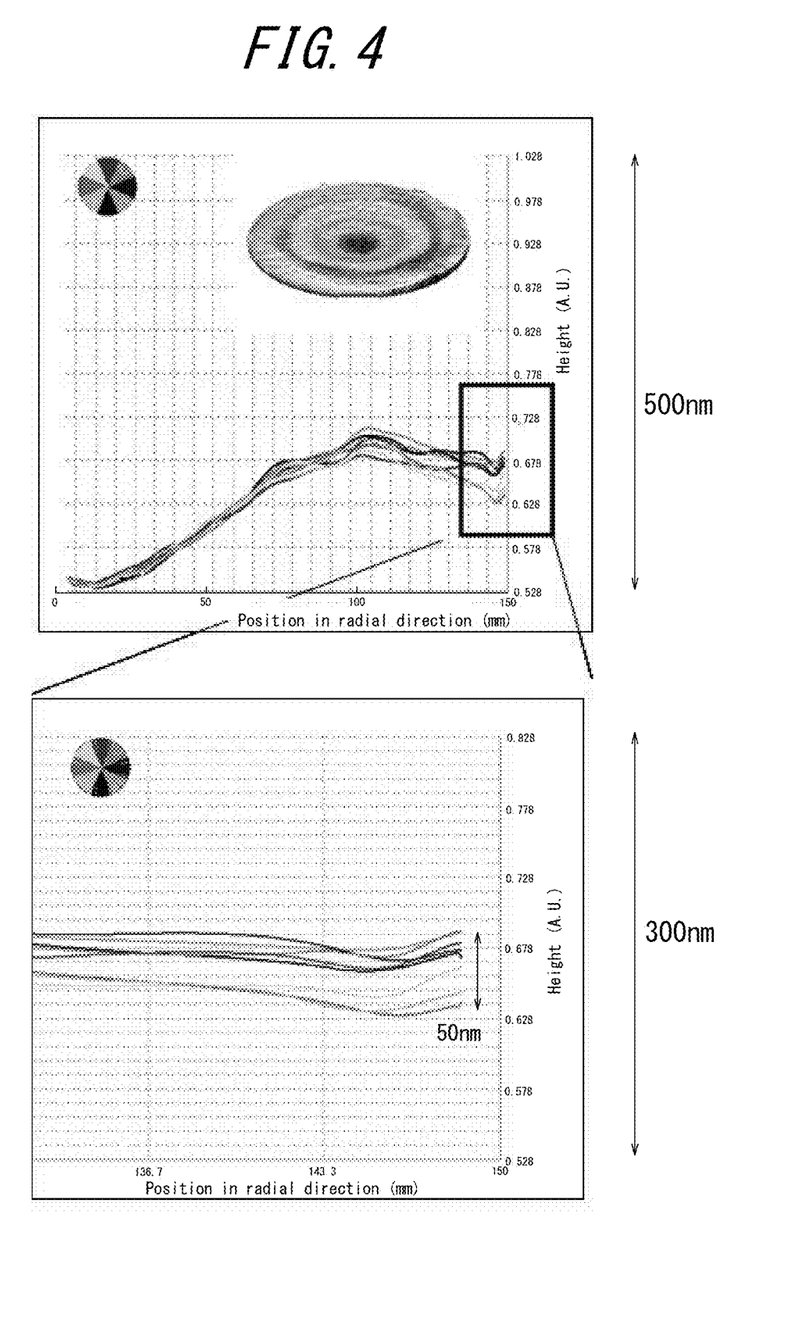
FIG. 4 is a graph illustrating the geometric profile of a silicon wafer subjected to single-side polishing in Example 1-2.
Figure 5:
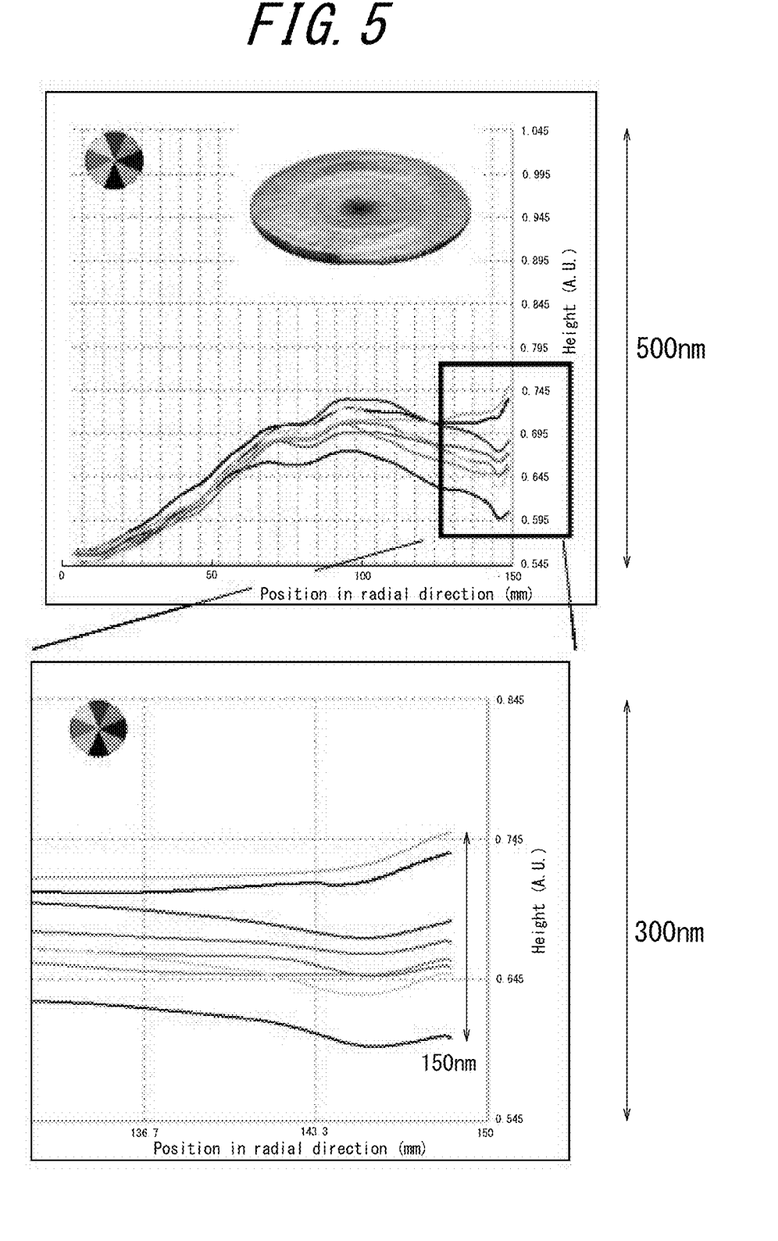
FIG. 5 is a graph illustrating the geometric profile of a silicon wafer subjected to single-side polishing in Conventional Example 1-1.

The geometry of the silicon wafers according to Examples 1-1, 1-2, and Conventional Example 1-1 after polishing was measured using a flatness measurement system (WaferSight manufactured by KLA-Tencor). The respective results are presented in FIG. 3 to FIG. 5. FIG. 3 to FIG. 5 present the geometric profiles of the silicon wafers after polishing, in Examples 1-1, 1-2, and Conventional Example 1-1, that are divided into eight sectors in the circumference direction (interval: 45 degrees). The horizontal axis of each graph represents the position in the radial direction from the center of the silicon wafer. Accordingly, the wafer center corresponds to 0 mm, and the peripheral edge of each wafer corresponds to 150 mm. The vertical axis represents the relative value of the thickness of each wafer, expressed in arbitrary unit (A.U.). On the other hand, the arrow in the diagram in the vertical direction represents the absolute value of the thickness range.

FIG. 3 to FIG. 5 demonstrate that thickness variation in the peripheral end portion was approximately 150 nm in Conventional Example 1-1, the thickness variation in the peripheral end portion was improved to 20 nm in Example 1-1, and the thickness variation in the peripheral end portion was 1.0 improved to 50 nm in Example 1-2.

Example 2

Example 2-1

Sixty three silicon wafers each having a diameter of 300 mm and a thickness of 775 μm were prepared. A polishing cloth made of suede was placed on a surface of a polishing plate, thereby performing final polishing on each silicon wafer using the single-wafer processing single-side polishing apparatus 100 illustrated in FIG. 2. Shifting of each silicon wafer was performed between polishing and polishing. The polishing conditions were as follows.

Polishing pressure: 135 g/cm$^2$
Number of polishing steps: six times (number of shifting steps: five times)
Total polishing time: 360 seconds
Polishing time of each polishing step: 60 seconds
Angle of rotation in shifting: 60 degrees
Polishing agent: alkaline polishing agent (containing colloidal silica)

Through the above single-side polishing, silicon wafers according to Example 2-1 were obtained.

Example 2-2

Silicon wafers according to Example 2-2 were obtained in the same manner as in Example 2-1 except that the number of polishing steps, the polishing time, and the rotation angle in Example 2-1 were changed to the conditions presented in Table 2 below.

Example 2-3

Silicon wafers according to Example 2-3 were obtained in the same manner as in Example 2-1 except that the number of polishing steps, the polishing time, and the rotation angle in Example 2-1 were changed to the conditions presented in Table 2 below.

Example 2-4

Silicon wafers according to Example 2-4 were obtained in the same manner as in Example 2-1 except that the number of polishing steps, the polishing time, and the rotation angle in Example 2-1 were changed to the conditions presented in Table 2 below.

Conventional Example 2-1

Silicon wafers according to Conventional Example 2-1 were obtained in the same manner as in Example 2-1 except that the number of polishing steps, the number of shifting steps, the polishing time, and the rotation angle in Example 2-1 were changed to the conditions presented in Table 2 below. Accordingly, shifting steps were not performed in Conventional Example 2-1.

TABLE 2

|  | Example 2-1 | Example 2-2 | Example 2-3 | Example 2-4 | Conventional Example 2-1 |
|---|---|---|---|---|---|
| Number of polishing step | 6 | 3 | 2 | 3 | 1 |
| Number of shifting step | 5 | 2 | 1 | 2 | N/A |
| Polishing time of each polishing step | 60 s | 120 s | 180 s | 120 s | 360 s |
| Angle of rotation in shifting | 60° | 120° | 180° | 5° | N/A |
| Total polishing time | 360 s | 360 s | 360 s | 360 s | 360 s |

(Evaluation 2)

Figure 6:
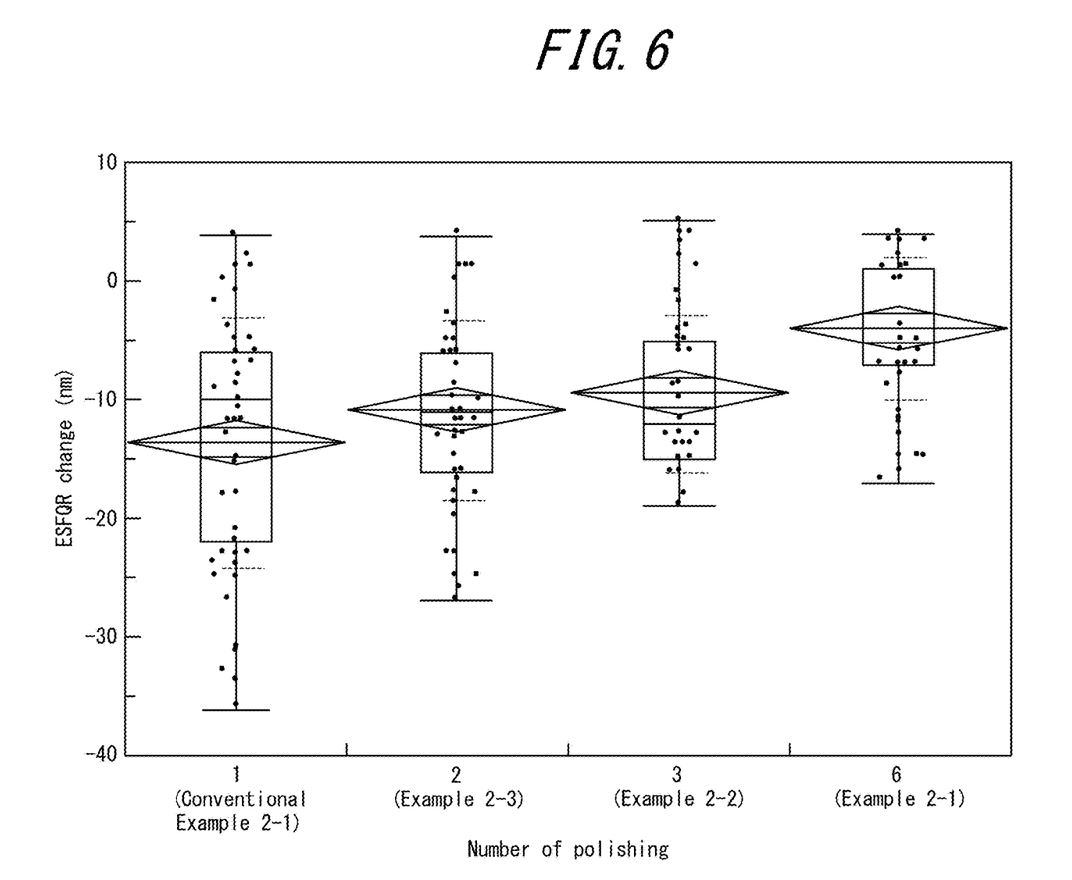
FIG. 6 is a graph illustrating change in the ESFQR of a silicon wafer between before and after single-side polishing in Examples 2.
Figure 7:
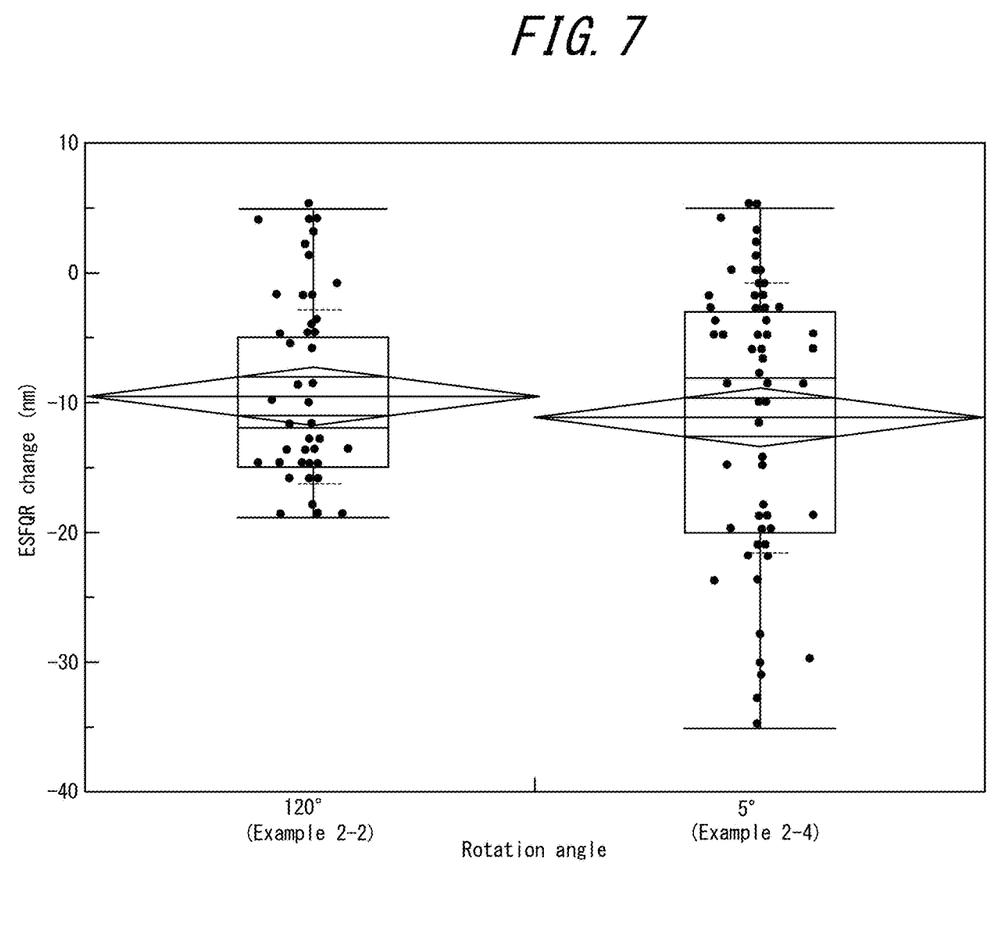
FIG. 7 is a graph illustrating change in the ESFQR of a silicon wafer between before and after single-side polishing in Examples 2.

The ESFQR (Edge flatness metric, Sector based, Front surface referenced, least sQuares fit reference plane, Range of the data within sector) of each of the silicon wafers obtained in Examples 2-1 to 2-4 and Conventional Example 2-1 was measured before and after polishing using a flatness measurement system (WaferSight manufactured by KLA-Tencor). FIG. 6 illustrates change in the ESFQR between before and after single-side polishing in Example 2-1, Example 2-2, Example 2-3, and Conventional Example 2-1 ([ESFQR before polishing]−[ESFQR after polishing]). Further, the mean value and the standard deviation of change in the ESFQR between before and after polishing in Example 2-1, Example 2-2, Example 2-3, and Conventional Example 2-1 are given in Table 3. Similarly, change in the ESFQR between before and after polishing in Example 2-2 and Example 2-4 is presented in FIG. 7, and the mean value and the standard deviation thereof are additionally given in Table 3.

ESFQR is an index indicating the flatness of a wafer, defined in SEMI standards. ESFQR is determined by calculating the sum of the absolute values of the maximum displacement from a reference plane obtained by the least square method for the wafer thickness of each of the sectors formed in the entire peripheral area of the wafer (divided into 72 equal parts in the circumference direction within the range of 30 mm from the peripheral edge of the wafer.) A smaller value of ESFQR means better flatness of a wafer.

TABLE 1

|  | Example 1-1 | Example 1-2 | Conventional Example 1-1 |
|---|---|---|---|
| Number of polishing step | 6 | 3 | 1 |
| Number of shifting step | 5 | 2 | N/A |
| Polishing time of each polishing step | 60 s | 120 s | 360 s |
| Angle of rotation in shifting | 60° | 120° | N/A |
| Total polishing time | 360 s | 360 s | 360 s |

FIG. 6 and Table 3 demonstrate that the absolute value of the change in the ESFQR value between before and after polishing and the variations were smaller in Examples 2-1 and 2-3 compared with Conventional Example 2-1. Further, FIG. 7 and Table 3 demonstrate that even in Example 2-4 in which the rotation angle determining the relative position, between the polishing head and each silicon wafer was 5 degrees, the absolute value of the change in the ESFQR value between before and after polishing and the variations were smaller compared with Conventional Example 2-1. Note that comparison of Example 2-2 and Example 2-4 demonstrates that when the rotation angle was (360/[polishing step number]) degrees, the absolute value of the change in the ESFQR value and the variations were smaller. Further, it was also found that performing the polishing steps and the shifting steps more times better ensures that the advantageous effects can achieved.

INDUSTRIAL APPLICABILITY

This disclosure provides a single-wafer processing single-side polishing method and a single-wafer processing single-side polishing apparatus, which increase the flatness of the semiconductor wafer having been polished and prevent variations in flatness.

REFERENCE SIGNS LIST

10, 100: Single-side polishing apparatus
11, 110: Backing plate
12, 120: Polishing head
13, 130: Polishing cloth
14, 140: Polishing plate
170: Control unit
180: Table
181: Rotary table
190: Tray

The invention claimed is:

1. A single-wafer processing method of polishing one side of a semiconductor wafer, comprising:
   (a) pressing the semiconductor wafer held by a polishing head against a polishing plate, such that the semiconductor wafer is polished; and
   (b) a shifting process comprising:
      (i) transferring the semiconductor wafer held by the polishing head from the polishing plate to a tray outside the polishing plate;
      (ii) then detaching the semiconductor wafer from the polishing head;
      (iii) placing the semiconductor wafer on the tray,
      (iv) moving a relative position of the semiconductor wafer placed and the polishing head in a rotation direction of the polishing head; and
      (v) then holding the semiconductor wafer placed with the polishing head,
   wherein:
   the (a) pressing is performed a plurality of N times, where N is an integer of 2 or more, and the (b) shifting process is performed (N−1) times between each of the (N−1) times of (a) pressings, and
   wherein the rotation direction to move the relative position is by (360/N) degrees in each of the (b) shifting processes.

2. A single-wafer processing apparatus for polishing one side of a semiconductor wafer processed in accordance with the method of claim 1, the apparatus comprising:
   a polishing head which holds the semiconductor wafer;
   a polishing plate to which a polishing cloth for polishing the semiconductor wafer is bonded;
   a table including a tray on which the semiconductor wafer is to be placed; and
   a controller that controls a relative position of the semiconductor wafer and the polishing head in a rotation direction of the polishing head when the semiconductor wafer placed on the tray is held by the polishing head, wherein the (a) pressing and the (b) shifting process are controlled by the controller, and the controller changes the rotation direction to move the relative position by (360/N) degrees in each of the (b) shifting processes by moving the relative position of the placed semiconductor wafer and the polishing head.

3. The single-wafer processing apparatus for polishing one side of a semiconductor wafer according to claim 2, wherein the table includes a rotating motor.

4. The single-wafer processing apparatus for polishing one side of a semiconductor wafer according to claim 2, wherein the polishing head comprises a rotation assembly and a transfer assembly.

* * * * *